US012615823B2

(12) United States Patent　　　(10) Patent No.:　US 12,615,823 B2
Tsuma et al.　　　(45) Date of Patent:　　Apr. 28, 2026

(54) METHOD OF MANUFACTURING SILICON CARBIDE SEMICONDUCTOR DEVICE

(71) Applicants:DENSO CORPORATION, Kariya-city (JP); TOYOTA JIDOSHA KABUSHIKI KAISHA, Toyota (JP); MIRISE Technologies Corporation, Nisshin (JP)

(72) Inventors: Hiroki Tsuma, Nisshin-city (JP); Yohei Iwahashi, Nisshin-city (JP); Masashi Uecha, Nisshin-city (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

(*) Notice: Subject to any disclaimer, the term of this patent is extended or adjusted under 35 U.S.C. 154(b) by 610 days.

(21) Appl. No.: 17/851,702

(22) Filed: Jun. 28, 2022

(65) Prior Publication Data

US 2023/0009078 A1　　Jan. 12, 2023

(30) Foreign Application Priority Data

Jul. 6, 2021　(JP) ................................. 2021-112146

(51) Int. Cl.
　*H10D 62/832*　　(2025.01)
　*H10D 30/66*　　(2025.01)
　*H10D 64/01*　　(2025.01)
(52) U.S. Cl.
　CPC ....... *H10D 62/8325* (2025.01); *H10D 30/668* (2025.01); *H10D 64/01366* (2026.01)

(58) Field of Classification Search
　CPC .............. H10D 62/8325; H10D 30/668; H01L 21/049; H01L 29/518; H01L 29/401; H01L 29/45; H01L 29/66068; H01L 29/7811; H01L 29/7813; H01L 29/4238; H01L 29/7397; H01L 29/1608; H01L 29/7825; H01L 29/4236; H01L 29/66704
　See application file for complete search history.

(56) References Cited

U.S. PATENT DOCUMENTS

2007/0045631 A1* 3/2007 Endo .................. H10D 62/8325
257/77

FOREIGN PATENT DOCUMENTS

| CN | 102422402 A | * | 4/2012 | ......... H01L 29/1608 |
| JP | H02244716 A | | 9/1990 | |
| JP | H0653165 A | * | 2/1994 | ........... H01L 21/316 |
| JP | 2007129261 A | * | 5/2007 | ......... H01L 29/4175 |

(Continued)

*Primary Examiner* — Mohammed Shamsuzzaman
(74) *Attorney, Agent, or Firm* — Posz Law Group, PLC

(57) ABSTRACT

A method of manufacturing a silicon carbide semiconductor device includes formation of an electrode and formation of a gate wiring. The electrode is formed to be electrically connected to a base layer and an impurity region included in a semiconductor substrate through a first contact hole. The gate wiring is formed to be electrically connected to a connection wiring through a second contact hole, and is made of material capable of deoxidizing an oxide film. The oxide film is removed by deoxidizing the oxide film formed on the connection wiring to remove the oxygen from the oxide film into the gate wiring through heating treatment for the gate wiring in the formation of the gate wiring or after the formation of the gate wiring.

7 Claims, 9 Drawing Sheets

(56)        References Cited

FOREIGN PATENT DOCUMENTS

| | | | |
|---|---|---|---|
| JP | 2010-062402 A | 3/2010 | |
| WO | WO-2019065462 A1 * | 4/2019 | ........... H01L 21/316 |

* cited by examiner

METHOD OF MANUFACTURING SILICON CARBIDE SEMICONDUCTOR DEVICE

CROSS REFERENCE TO RELATED APPLICATIONS

This application is based on Japanese Patent Application No. 2021-112146 filed on Jul. 6, 2021, the disclosure of which is incorporated herein by reference.

TECHNICAL FIELD

The present disclosure relates to a method for manufacturing a silicon carbide (SiC) semiconductor device made of silicon carbide.

BACKGROUND

A SiC semiconductor device may include a metal oxide semiconductor field effect transistor (MOSFET) having, for example, a base layer and a source region at a semiconductor substrate made of SiC.

SUMMARY

The present disclosure describes a method for manufacturing a SiC semiconductor device including formation of an electrode and formation of a gate wiring.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
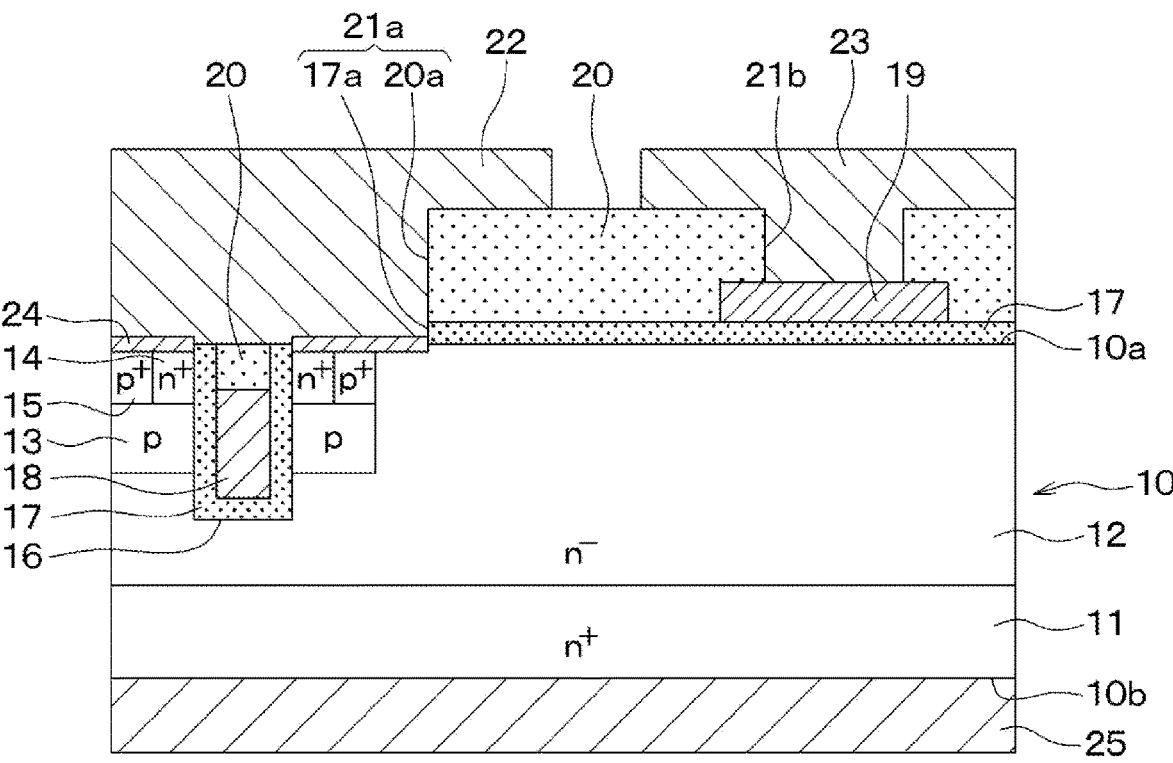
FIG. 1 is a cross-sectional view of a SiC semiconductor device according to a first embodiment.

A SiC semiconductor device may include a drift layer and a base layer formed on the drift layer. In the SiC semiconductor device, a gate structure provided with a gate electrode is formed on a gate insulation film, and a connection wiring connected to the gate electrode is formed at a surface of the semiconductor substrate. The gate electrode and the connection wiring are made of polysilicon.

An interlayer insulation film is formed at the surface of the semiconductor substrate in order to cover the gate electrode and the connection wiring. A first contact hole for exposing, for example, the source region is formed at the interlayer insulation film, and a second contact hole for exposing the connection wiring is formed at the interlayer insulation film.

A source electrode connected to, for example, the source region through the first contact hole is formed on the interlayer insulation film, and a gate wiring connected to the connection wiring through the second contact hole is formed on the interlayer insulation film. A metal silicide film is disposed between the source electrode and the source region or the like.

Such a SiC semiconductor device may be manufactured as described in the following. After forming the interlayer insulation film at the surface of the semiconductor substrate on which, for example, the base layer and the source region is formed, the first contact hole and the second contact hole are formed at the same time. An oxide film is formed at a portion of the semiconductor substrate exposed from the first contact hole through thermal oxidation, and the oxide film is formed at the connection wiring exposed from the second contact hole through thermal oxidation. Since the semiconductor substrate is made of SiC and the connection wiring is made of polysilicon, the oxide film on the connection wiring is formed to be thicker than the oxide film on the semiconductor substrate. When the metal silicide film is formed with a metal layer, the oxide film suppresses the diffusion of atoms included in the metal layer into, for example, the connection wiring.

Subsequently, the oxide film formed at the portion of the semiconductor substrate exposed from the first contact hole is removed while leaving the oxide film on the connection wiring. The metal layer made of, for example, nickel is formed to be disposed inside the first contact hole, the metal silicide film is formed at the portion of the semiconductor substrate exposed from the first contact hole through heating treatment. Since the oxide film is formed on the connection wiring, the diffusion of the atoms included in the metal layer into, for example, the connection wiring is suppressed, and a change in the characteristics of the SiC semiconductor device is suppressed.

The oxide film formed on the connection wiring is removed. An upper electrode connected to, for example, the source region through the first contact hole is formed, and the gate wiring electrically connected to the connection wiring through the second contact hole is formed.

However, for manufacturing the above-mentioned SiC semiconductor device, it is necessary to remove the oxide film on the connection wiring through an additional process, and thus the manufacturing process tends to be longer.

According to an aspect of the present disclosure, a method manufactures a SiC semiconductor device. The method includes preparation of a semiconductor substrate, formation of an interlayer insulation film, formation of a first contact hole, formation a second contact hole, formation of an oxide film, formation of a metal a metal silicide film, removal of an unreacted metal layer, formation of an electrode, and formation of a gate wiring. The preparation of the semiconductor substrate includes formation of a gate insulation film, formation of a gate electrode and formation of a connection wiring. The semiconductor substrate is made of silicon carbide and includes a substrate, a drift layer, a base layer and an impurity region. The substrate has a first conductivity or a second conductivity. The drift layer has the first conductivity formed on the substrate. The base layer has the second conductivity formed on the drift layer. The impurity region has the first conductivity formed at a surface layer portion of the base layer. The gate insulation film is formed at a portion of the base layer between the drift layer and the impurity region. The gate electrode is formed on the gate insulation film. The connection wiring is formed above a surface of the semiconductor substrate at a side closer to the base layer, and the connection wiring is connected to the gate electrode and made of polysilicon. The interlayer insulation film is formed to cover the base layer, the impurity region, the gate electrode and the connection wiring. The first contact hole is formed at a first region including the interlayer insulation film to expose the base layer and the impurity region. The second contact hole is formed at a second region including the interlayer insulation to expose the connection wiring. The oxide film is formed at a portion of the connection wiring exposed from the second contact hole through thermal oxidation. The metal layer is formed at a portion of the semiconductor substrate exposed from the first contact hole. The metal silicide film is formed by reacting the metal layer with the semiconductor substrate through heating. The unreacted layer as a portion of the metal layer is removed. The unreacted layer is different from the metal silicide film. The electrode is formed to be electrically connected to the base layer and the impurity region through the first contact hole. The gate wiring is formed to be electrically connected to the connection wiring through the second contact hole. The gate wiring has a portion made of material capable of deoxidizing the oxide film formed on the connection wiring to remove oxygen from the oxide film. In the formation of the gate wiring or after the formation of the gate wiring, the oxide film is removed by deoxidizing the oxide film to remove the oxygen from the oxide film into the gate wiring through heating treatment for the gate wiring.

According to the above-mentioned method, the oxide film is removed by removing the oxygen from the oxide film into the gate wiring, when the heating treatment for the gate wiring is performed. Therefore, without an additional process for removing the oxide film, it is possible to inhibit a situation in which the manufacturing process takes longer.

Hereinafter, embodiments of the present disclosure will be described with reference to the drawings. In the following embodiments, the same reference numerals are assigned to parts that are the same or equivalent to each other to describe the same.

First Embodiment

A first embodiment will be described with reference to the drawings. The present embodiment describes that an inverted MOSFET with a trench gate structure is formed as a SiC semiconductor device. The following describes the structure of the SiC semiconductor device.

As illustrated in FIG. 1, the SiC semiconductor device includes a semiconductor substrate 10 made of SiC. The semiconductor substrate 10 in the SiC semiconductor device includes an $n^+$-type substrate 11 made of SiC. In the present embodiment, the substrate 11 has an off-angle of 0 to 8 degrees with respect to, for example, a (0001) Si plane, and the substrate 11 has an n-type impurity concentration of, for example, $1.0 \times 10^{19}$/cm$^3$, such as nitrogen or phosphorus, and a thickness of about 50 micrometers (μm) to 300 micrometers (μm). In the present embodiment, a drain region is included in the substrate 11.

On the surface of the substrate 11, for example, an $n^-$-type drift layer 12 made of SiC and a p-type base layer 13 are formed by, for example, epitaxial growth. In the following, the surface of the semiconductor substrate 10 at a side closer to the base layer 13 is referred to as a first surface 10a of the semiconductor substrate 10, and the surface of the semiconductor substrate 10 at a side closer to the substrate 11 is referred to as a second surface 10b of the semiconductor substrate 10.

The drift layer 12 has, for example, an n-type impurity concentration of about $1.0 \times 10^{15}$/cm$^3$ to $50.0 \times 10^{15}$/cm$^3$ and a thickness of about 5 μm to 50 μm. The base layer 13 is formed on a portion of the drift layer 12. The base layer 13 has, for example, a p-type impurity concentration of about $2.0 \times 10^{17}$/cm$^3$ and a thickness of about 0.5 μm to 2 μm.

An $n^+$-type source region 14 and a $p^+$-type contact region 15 are formed at a surface layer portion of the base layer 13. The source region 14 is formed to be in contact with a side surface of a trench 16, and a contact region 15 is formed to be at a side opposed to the trench 16 to sandwich the source region 14. The source region 14 has an n-type impurity concentration at the surface layer portion, in other words, a surface concentration of, for example, $1.0 \times 10^{21}$/cm$^3$. The contact region 15 has a p-type impurity concentration at the surface layer portion, in other words, a surface concentration of, for example, $1.0 \times 10^{21}$/cm$^3$. In the present embodiment, the source region 14 correspond to an impurity region. The contact region 15 may be regarded as a region where a portion of the base layer 13 has a higher impurity concentration. In other words, the contact region 15 may be regarded as a portion of the base layer 13.

In the semiconductor substrate 10, trenches 16 penetrate the source region 14 and the base layer 13 and reach the drift layer 12. Each of the trenches 16 has a width of, for example, 6 μm. Although only a single trench 16 is shown in FIG. 1, multiple trenches 16 are provided at equal intervals in the right-left direction of FIG. 1 to form a stripe pattern.

Each of the trenches 16 is filled with a gate insulation film 17 formed so as to cover a wall surface of each of the trenches 16, and a gate electrode 18 made of polysilicon or the like is formed on the gate insulation film 17. Accordingly, a trench gate structure is formed. In the present embodiment, a portion of the wall surface of the trench 16 in contact with the base layer 13 corresponds to the surface of the base layer sandwiched between the impurity region and the drift layer.

The gate insulation film 17 is also formed on a surface other than the inner wall surface of the trench 16. The gate insulation film 17 is formed from the inner wall surface of the trench 16 over the first surface 10a of the semiconductor substrate 10. At a portion of the gate insulation film 17 formed at the first surface 10a of the semiconductor substrate 10, a contact hole 17a for exposing the source region 14 and the contact region 15 is formed.

On a portion of the gate insulation film 17 formed at the first surface 10a of the semiconductor substrate 10, a connection wiring 19 connected to the gate electrode 18 is formed. The connection wiring 19 is formed by patterning the polysilicon formed on the first surface 10a of the semiconductor substrate 10 when the polysilicon is arranged at the trench 16 to form the gate electrode 18. The connection wiring 19 is electrically connected to the gate electrode 18 in a cross section different from that in FIG. 1.

When the polysilicon formed on the first surface 10a of the semiconductor substrate 10 is patterned to form the connection wiring 19, the polysilicon embedded in the trench 16 has a portion located at a side closer to an aperture of the trench 16 to be removed. The aperture of the trench 16 may also be referred to as an opening of the trench 16. Therefore, the gate electrode 18 is not embedded at a side closer to the aperture of the trench 16. In other words, the gate insulation film 17 located at a side closer to the aperture of the trench 16 is exposed from the gate electrode 18. Although not particularly limited, for example, the trench 16 is in a state such that the gate electrode 18 is not arranged at a portion of the trench 16 about 50 nanometers (nm) to 100 nanometers (nm) from the aperture of the trench 16.

An interlayer insulation film 20 is formed on the first surface 10a of the semiconductor substrate 10 to cover, for example, the gate electrode 18 and the gate insulation film 17. The interlayer insulation film 20 for covering the gate electrode 18 is arranged to embed the aperture of the trench 16. The interlayer insulation film 20 according to the present embodiment is made of Borophosphosilicate Glass (BPSG).

A contact hole 20a for exposing the source region 14 and the contact region 15 is connected to the contact hole 17a and formed at the interlayer insulation film 20. The contact hole 20a formed at the interlayer insulation film 20 functions as a single contact hole together with the contact hole 17a formed at the gate insulation film 17. In the following, the contact hole 17a and the contact hole 20a are collectively referred to as a first contact hole 21a.

A second contact hole 21b for exposing the connection wiring 19 is formed at the interlayer insulation film 20. The pattern of the first contact hole 21a and the pattern of the second contact hole 21b are arbitrary. For example, the pattern may be a pattern with an array of multiple square shapes, a pattern with an array of rectangular linear shapes, or a pattern with aligned linear shapes.

A source electrode 22 is formed on the interlayer insulation film 20. The source electrode 22 is electrically connected to the source region 14 and the contact region 15 through the first contact hole 21a. The gate wiring 23 is formed on the interlayer insulation film 20. The gate wiring 23 is electrically connected to the connection wiring 19 through the second contact hole 21b.

The gate wiring 23 is made of material capable of removing oxygen from the oxide film. In other words, the gate wiring 23 is made of material capable of reducing the oxygen in the oxide film or capable of deoxidizing the oxide film. In the present embodiment, the gate wiring 23 is made of aluminum or material having aluminum as a main component. The source electrode 22 is not particularly limited. In the present embodiment, the source electrode 22 and the gate wiring 23 are formed in the same process. As similar to the gate wiring 23, the source electrode 22 according to the present embodiment is made of aluminum or material having the aluminum as a main component.

The source electrode 22 may be made of material different from the gate wiring 23, and may not be made of the material capable of removing the oxygen from the oxide film. In the present embodiment, the source electrode 22 corresponds to an electrode.

A metal silicide film 24 is formed at a portion of the semiconductor substrate 10 exposed from the first contact hole 21a. The metal silicide film 24 reduces a contact resistance between the source region 14 and the contact region 15. The source electrode 22 is electrically connected to the source region 14 and the contact region 15 through the metal silicide film 24. The metal silicide film 24 according to the present embodiment is made of, for example, nickel silicon (NiSi). The metal silicide film 24 corresponds to a first silicide film.

A drain electrode 25 that is electrically connected to the substrate 11 is formed at a side closer to the second surface 10b of the semiconductor substrate 10. In the SiC semiconductor device according to the present embodiment, with such a structure, the MOSFET with an n-channel type inverted trench gate structure is formed.

In such a SiC semiconductor device, when a voltage larger than or equal to a predetermined threshold voltage is applied to the gate electrode 18 in a state where a voltage lower than the voltage of the drain electrode 25 is applied to the source electrode 22, an n-type inversion layer, in other words, a channel is formed at a portion of the base layer 13 in contact with the trench 16. Electrons are supplied from the source region 14 to the drift layer 12 through the inversion layer so that the SiC semiconductor device is turned on.

The following describes a method of manufacturing the SiC semiconductor device with reference to FIGS. 2A to 2I.

Figure 2A:
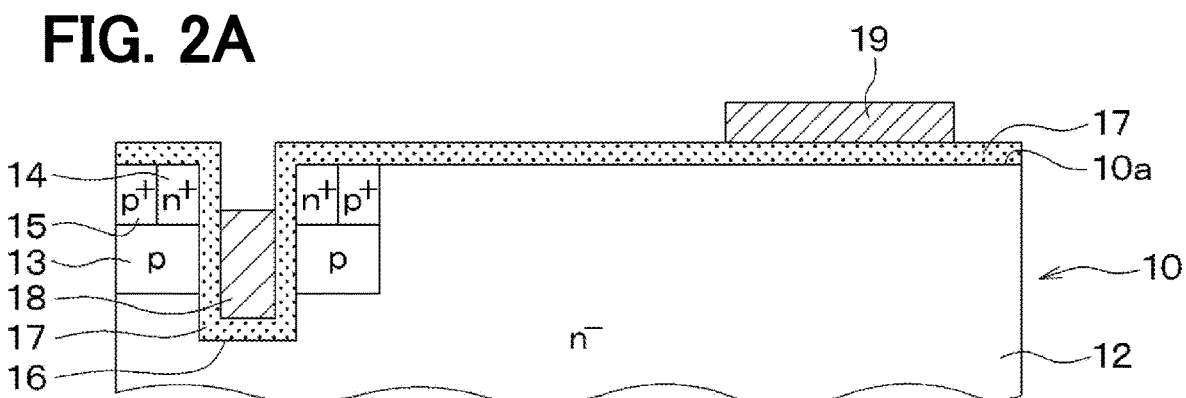
FIG. 2A is a cross-sectional view showing a manufacturing process of the SiC semiconductor device shown in FIG. 1.

As illustrated in FIG. 2A, the base layer 13, the source region 14, the contact region 15, the trench 16, the gate insulation film 17, the gate electrode 18 and the connection wiring 19 are formed at the semiconductor substrate 10 made of SiC. In this process, the gate insulation film 17 formed at the wall surface of the trench 16 and the gate insulation film 17 formed at the first surface 10a of the semiconductor substrate 10 are connected to each other.

In the present embodiment, after the formation of the trench 16, the polysilicon is formed by, for example, Chemical Vapor Deposition (CVD) to form the gate electrode 18 for embedding the trench 16 and deposit the polysilicon on the first surface 10a of the semiconductor substrate 10. Subsequently, the polysilicon formed on the first surface 10a of the semiconductor substrate 10 is patterned to form the connection wiring 19 connected to the gate electrode 18. The polysilicon embedded in the trench 16 located at a portion at a side closer the aperture of the trench 16 is removed. Therefore, the gate electrode 18 is not embedded at a side closer to the aperture of the trench 16.

Although not particularly shown, dangling bonds at the interface between the semiconductor substrate 10 and the gate insulation film 17 is terminated by a nitrogen through a nitrogen termination process by heating treatment in an oxygen-nitrogen atmosphere, in other words, NO atmosphere in the present embodiment. The dangling bonds at the interface between the base layer 13 and the gate insulation film 17 is terminated by the nitrogen. As a result, the threshold voltage can be lowered by lowering the interface potential.

Figure 2B:
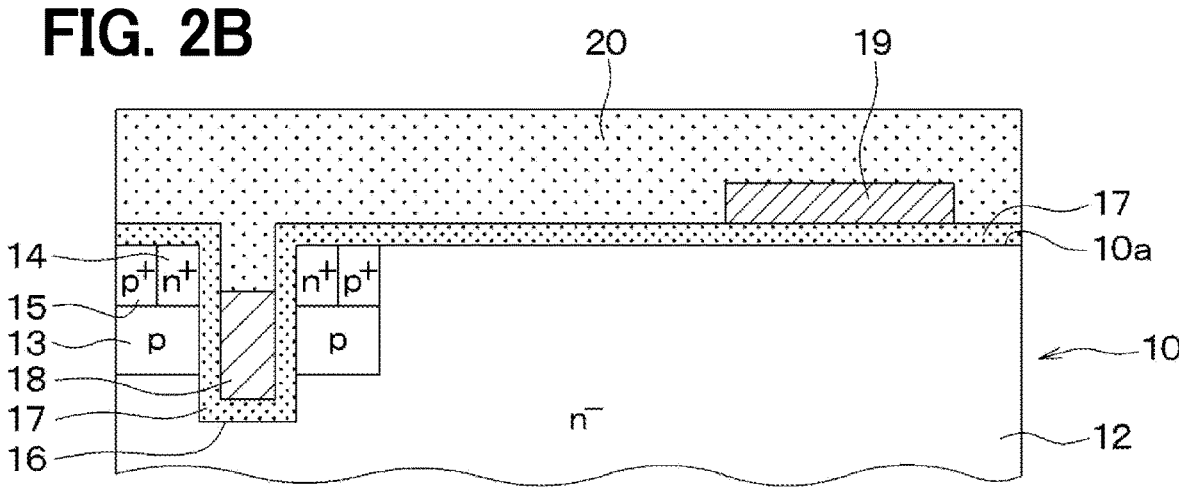
FIG. 2B is a cross-sectional view showing a manufacturing process of the SiC semiconductor device continued from FIG. 2A.

As illustrated in FIG. 2B, the interlayer insulation film 20 is formed to cover, for example, the gate electrode 18 and the connection wiring 19 by, for example, the CVD. The interlayer insulation film 20 is arranged to embed a portion of the trench 16 at a side closer to the aperture of the trench 16.

Figure 2C:
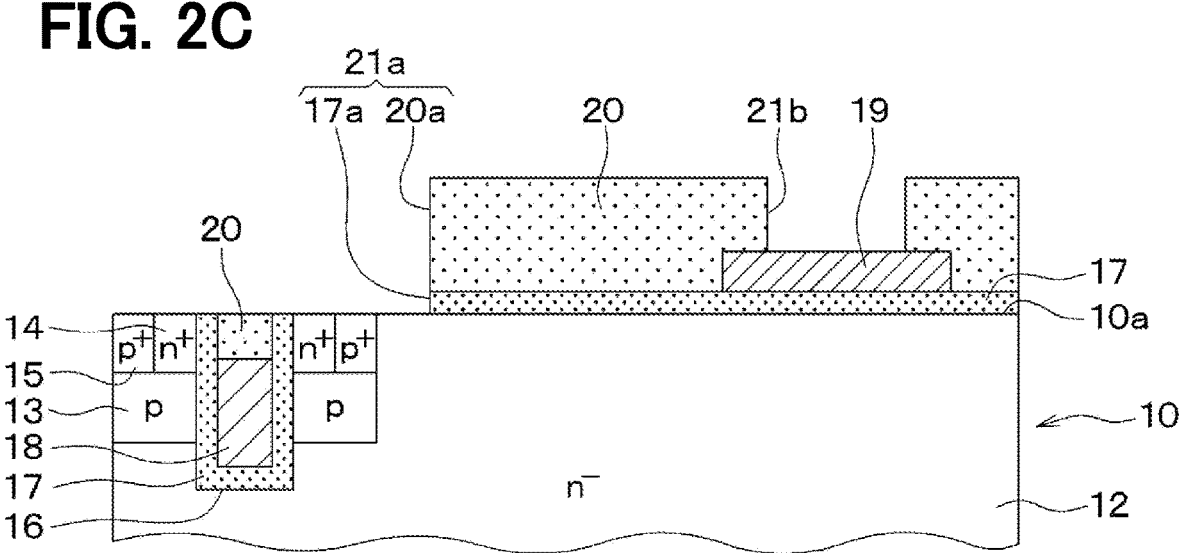
FIG. 2C is a cross-sectional view showing a manufacturing process of the SiC semiconductor device continued from FIG. 2B.

As illustrated in FIG. 2C, the first contact hole 21a for exposing the source region 14 and the contact region 15 and the second contact hole 21b for exposing the connection wiring 19 are formed at the same time by, for example, etching by adopting a mask (not shown).

Figure 2D:
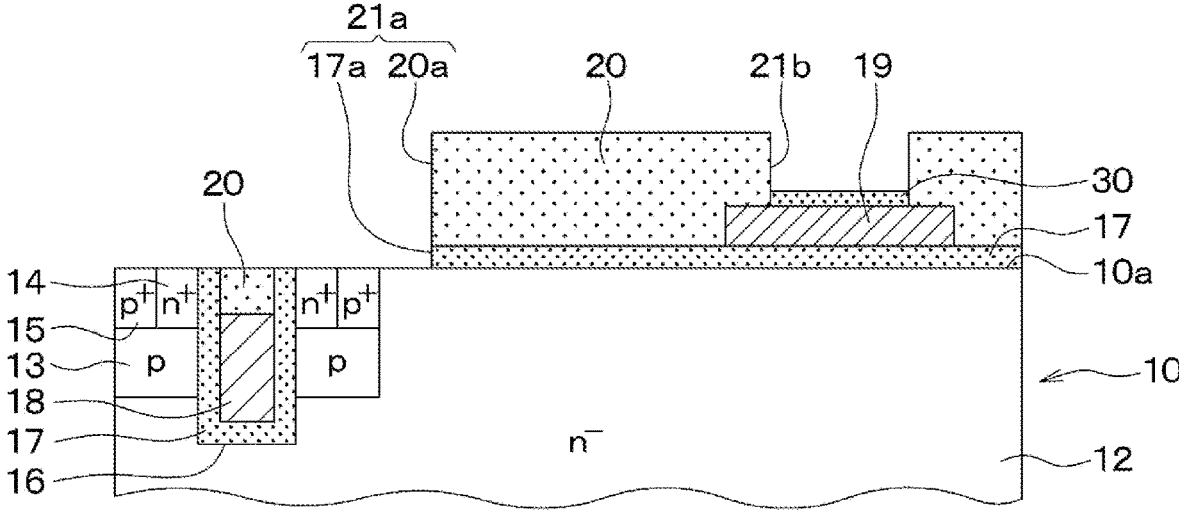
FIG. 2D is a cross-sectional view showing a manufacturing process of the SiC semiconductor device continued from FIG. 2C.

As illustrated in FIG. 2D, an oxide film 30 with the thickness of about 1 nm to 10 nm is formed at a portion of the connection wiring 19 exposed from the second contact hole 21b through thermal oxidation. The oxide film 30 is formed by, for example, dry oxidation at 700 degrees Celsius for 40 minutes or pyrooxidation at 700 degrees Celsius for 5 minutes.

Figure 3:
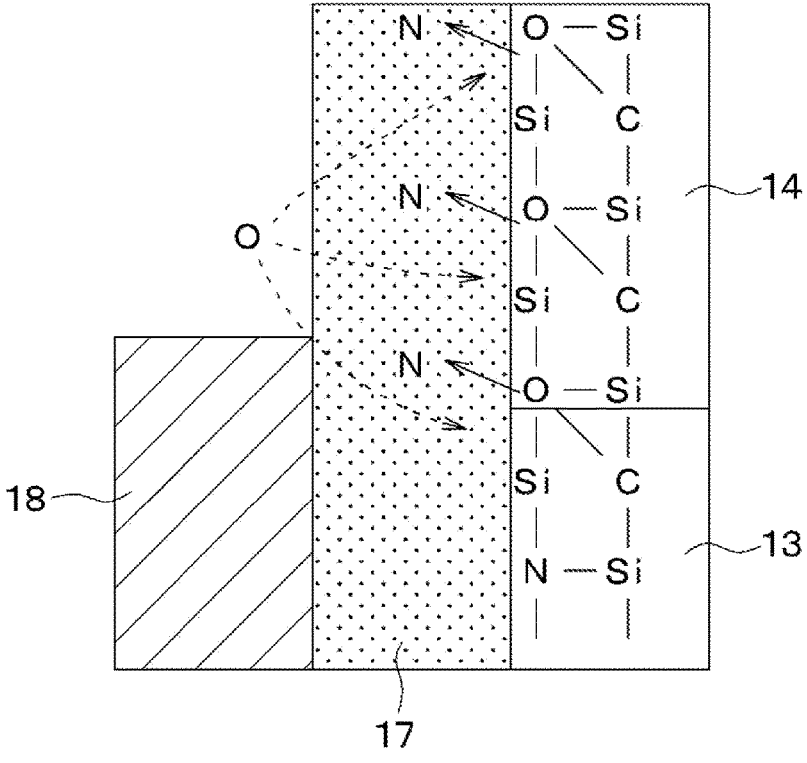
FIG. 3 is a schematic diagram that illustrates a composition of an interface between a semiconductor substrate and a gate insulation film.
Figure 4:
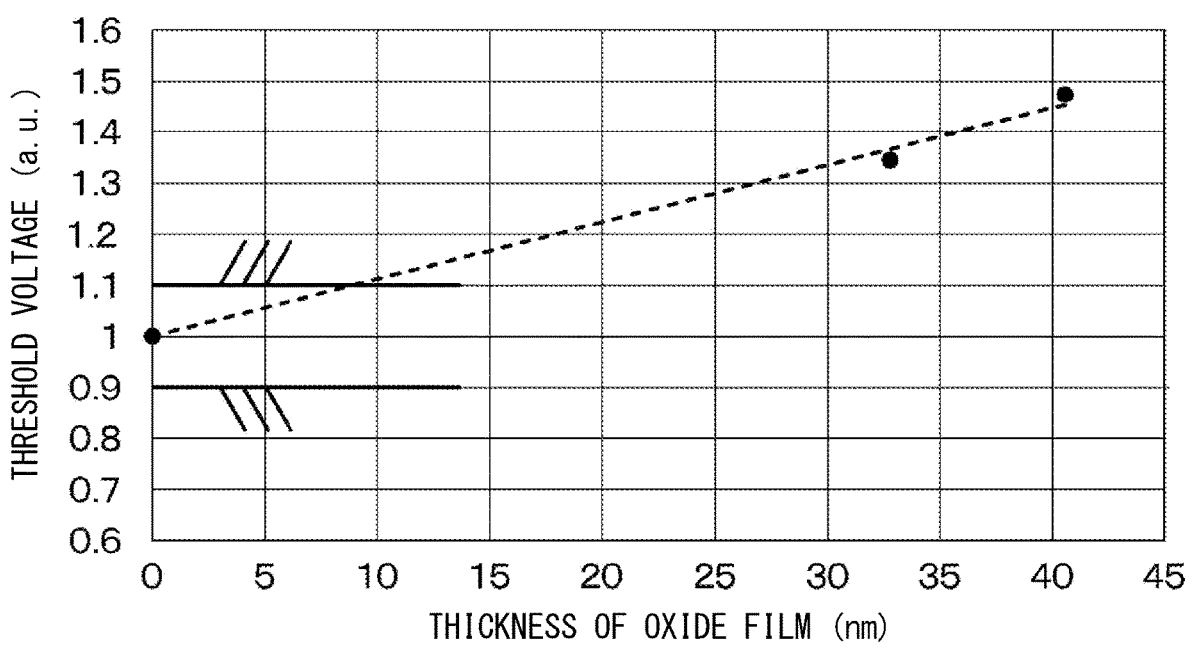
FIG. 4 illustrates relationship between a thickness of an oxide film and a threshold value.

In the formation of the oxide film 30 in the process, oxygen may enter the semiconductor substrate 10 through the gate insulation film 17 from a side closer to the aperture of the trench 16 where the gate electrode 18 is not arranged. In this situation, oxygen easily enters the semiconductor substrate 10 as the thickness of the oxide film 30 is relatively thick. As illustrated in FIG. 3, when oxygen enters the semiconductor substrate 10, the nitrogen terminated at the interface with the gate insulation film 17 in the semiconductor substrate 10 is replaced with oxygen, and the interface state becomes higher so that the threshold voltage also becomes higher. As illustrated in FIG. 4, the inventors in the present application had reviewed and confirmed that the threshold voltage rises to a value 10% or higher than a reference value as the thickness of the oxide film 30 is larger than 10 nm. The reference value described herein refers to a threshold value in the case of the thickness of the oxide film 30 being 0 nm as a reference value. In other words, a threshold value of the voltage is 1. However, the threshold value may have an error about 10% with respect to the reference value. Therefore, in the present embodiment, the thickness of the oxide film 30 is formed to be 10 nm or shorter.

As described above, the semiconductor substrate 10 according to the present embodiment is made of SiC as the material that is unlikely to be oxidized as compared with silicon. When the oxide film 30 is formed as a thin film to be 10 nm or shorter, the oxide film is substantially not formed at a portion of the first surface 10a of the semiconductor substrate 10 exposed from the first contact hole 21a.

Figure 2E:
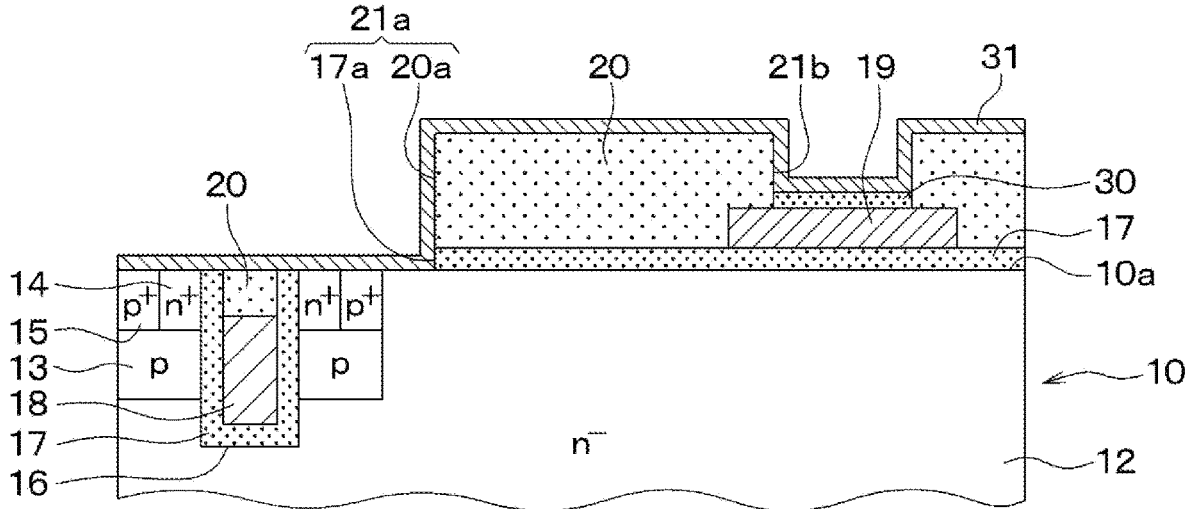
FIG. 2E is a cross-sectional view showing a manufacturing process of the SiC semiconductor device continued from FIG. 2D.

As illustrated in FIG. 2E, a metal layer 31 such as nickel is formed at a portion exposed from the first contact hole 21a through, for example, sputtering. Before performing this process, for example, wet etching may be performed if necessary to remove the oxide film that may be formed at a portion of the first surface 10a of the semiconductor substrate 10 exposed from the first contact hole 21a.

Figure 2F:
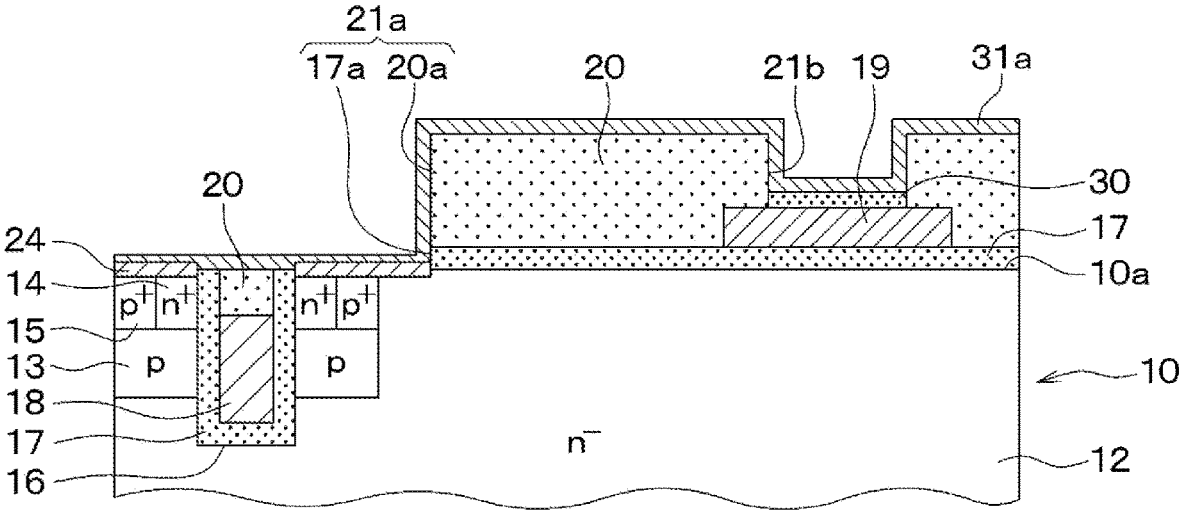
FIG. 2F is a cross-sectional view showing a manufacturing process of the SiC semiconductor device continued from FIG. 2E.

As illustrated in FIG. 2F, the semiconductor substrate 10 exposed from the first contact hole 21a is reacted with the metal layer 31 to form the metal silicide film 24 by heating treatment around 700 to 800 degrees Celsius under nitrogen atmosphere. Since the oxide film 30 is formed on the connection wiring 19 exposed from the second contact hole

21b at this time, it is possible to suppress the diffusion of the atoms included in the metal layer 31 into, for example, the connection wiring 19.

In the present embodiment, since the nickel film is formed as the metal layer 31, the metal silicide film 24 made of nickel silicon is formed. The portion of the metal layer 31 that does not react with the semiconductor substrate 10, in other words, SiC remains as an unreacted metal layer 31a.

Figure 2G:
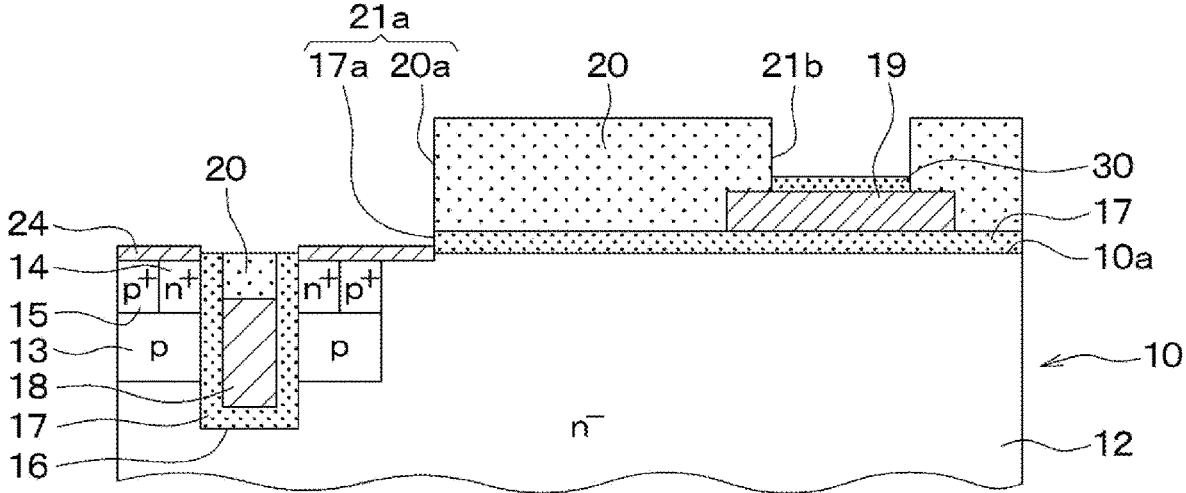
FIG. 2G is a cross-sectional view showing a manufacturing process of the SiC semiconductor device continued from FIG. 2F.

As illustrated in FIG. 2G, the unreacted metal layer 31a is removed by, for example, wet etching. Subsequently, although not particularly shown, the contact resistance between the metal silicide film 24 and the semiconductor substrate 10 (in other words, the source region 14 and the contact region 15) are further reduced by heating treatment around 950 to 1050 degrees Celsius.

Figure 2H:
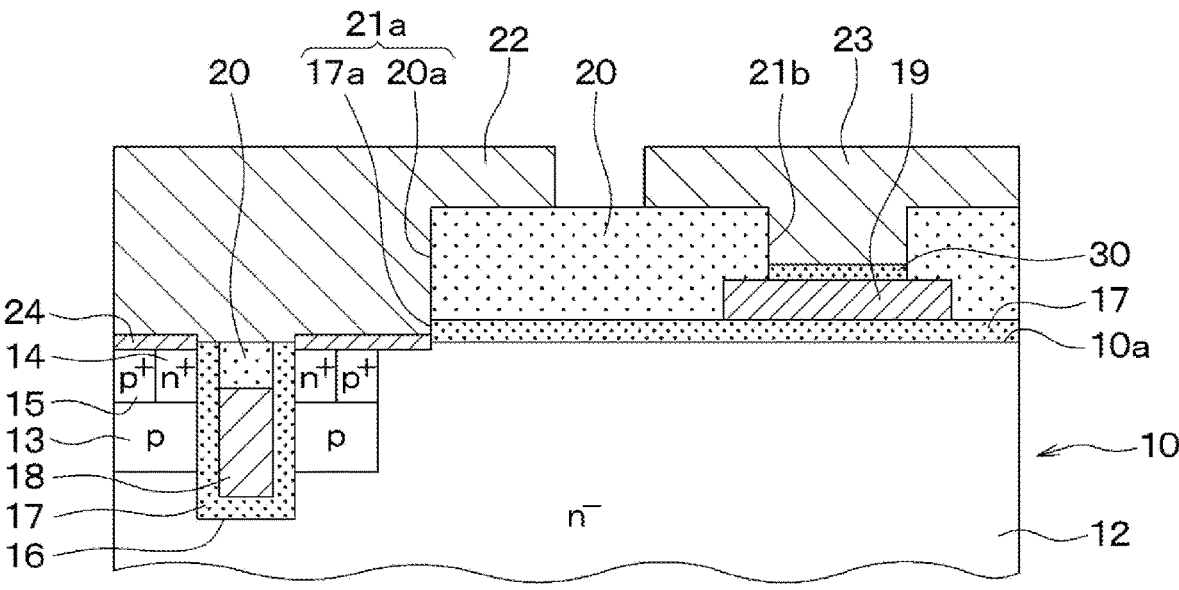
FIG. 2H is a cross-sectional view showing a manufacturing process of the SiC semiconductor device continued from FIG. 2G.

As illustrated in FIG. 2H, after the metal layer is formed above the interlayer insulation film 20 by, for example, the CVD, the metal layer is patterned to form the source electrode 22 and the gate wiring 23 by, for example, etching with a mask (not shown). The gate wiring 23 is made of material capable of removing the oxygen from the oxide film 30 as described above. In the present embodiment, since the common metal layer is patterned to form the source electrode 22 and the gate wiring 23, the material of the source electrode 22 is the same as the material of the gate wiring 23.

Figure 2I:
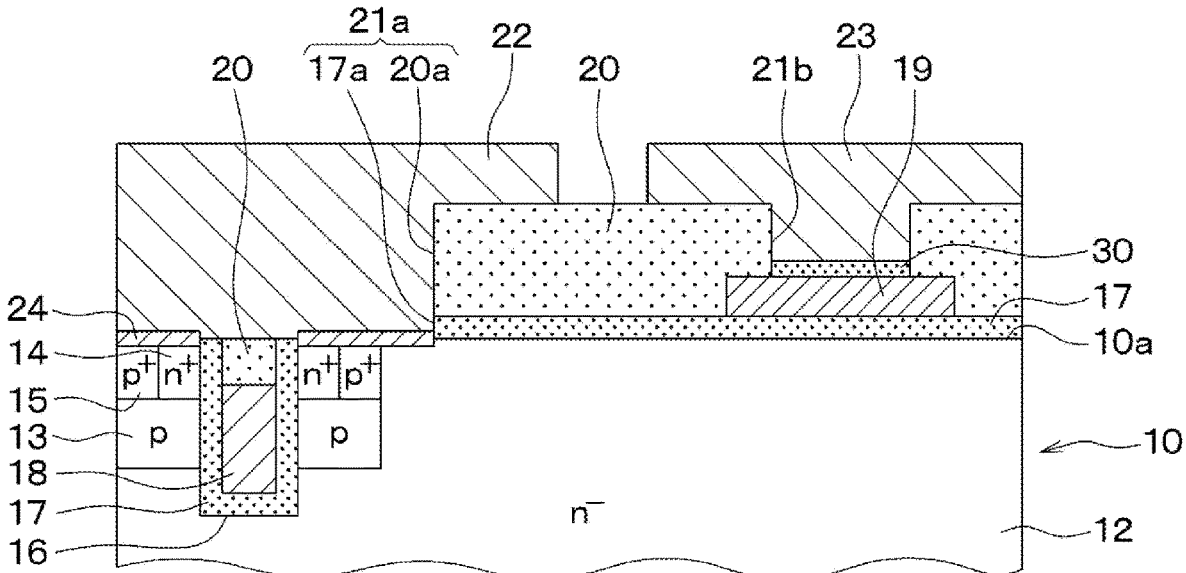
FIG. 2I is a cross-sectional view showing a manufacturing process of the SiC semiconductor device continued from FIG. 2H.

As illustrated in FIG. 2I, the film quality of each of the source electrode 22 and the gate wiring 23 is stabilized by heating the gate wiring 23 to a temperature equal to or lower than the melting point of the gate wiring 23 and higher than or equal to the temperature of, for example, soldering as a subsequent process. The oxide film 30 formed on the connection wiring 19 at this time is made of material capable of removing the oxygen from the oxide film 30. Therefore, the oxide film 30 can be removed by transporting the oxygen to the gate wiring 23. In other words, in the present embodiment, the stabilization of the film quality of the gate wiring 23 and the removal of the oxide film 30 are performed in the same process. In the present embodiment, this process corresponds to heating treatment for the gate wiring 23. As described above, the SiC semiconductor device according to the present embodiment is manufactured.

According to the present embodiment as described above, the gate wiring 23 is made of the material capable of removing the oxygen from the oxide film 30. When the heating treatment for stabilizing the film quality of the gate wiring 23, the oxide film 30 is removed by removing the oxygen from the oxide film 30 into the gate wiring 23. Therefore, without an additional process to remove the oxide film 30, it is possible to inhibit a situation in which the manufacturing process takes longer.

In the present embodiment, after forming the gate electrode 18, when the oxide film 30 is formed by performing nitrogen termination treatment, the thickness of the oxide film 30 is set to be shorter than or equal to 10 nm. Therefore, it is possible to inhibit a situation in which the nitrogen at the interface of the base layer 13 with the gate insulation film 17 is replaced with the oxygen, and it is possible to inhibit a situation in which the on-resistance increases due to an increase in the interface potential.

Second Embodiment

The following describes a second embodiment. In contrast to the first embodiment, a barrier metal film is formed. The other configurations are the same as those of the first embodiment, and therefore a description of the same configurations will be omitted below.

Figure 5:
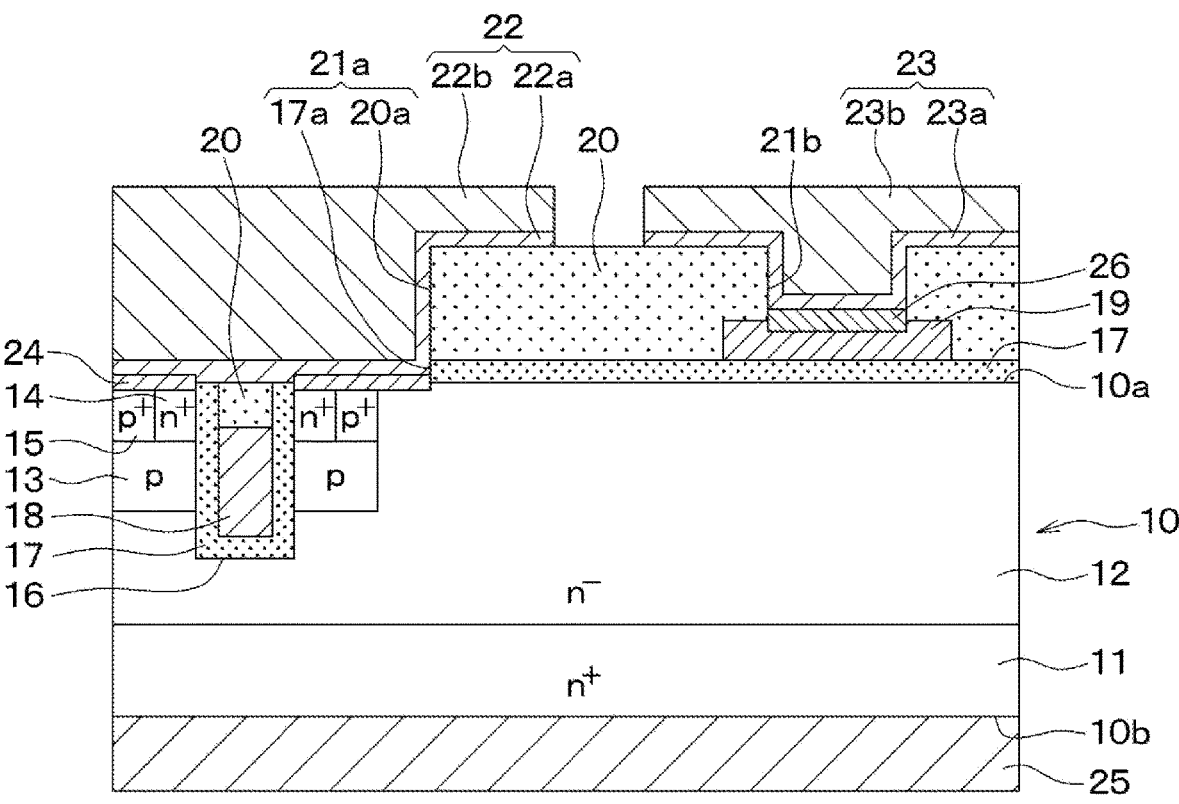
FIG. 5 is a cross-sectional view of a SiC semiconductor device according to a second embodiment.

In the semiconductor device according to the present embodiment, as illustrated in FIG. 5, the source electrode 22 and the gate wiring 23 respectively have barrier metal films 22a, 23a, and respectively have main wiring portions 22b, 23b. The main wiring portions 22b, 23b are respectively stacked on the barrier metal films 22a, 23a. The main wiring portion 23b is made of material having, for example, aluminum or an alloy containing aluminum as a main component. The barrier metal films 22a, 23a are made of material for suppressing the diffusion of aluminum in the main wiring portions 22b, 23b into, for example, the connection wiring 19. The barrier metal films 22a, 23a are made of material capable of removing oxygen from the oxide film 30 and more difficult to diffuse atoms as compared with the main wiring portions 22b, 23b. The barrier metal films 22a, 23a according to the present embodiment is made of, for example, titanium.

A metal silicide film 26 is formed between the barrier metal film 23a of the gate wiring 23 and the connection wiring 19. The metal silicide film 26 reduces the contact resistance between the barrier metal film 23a and the connection wiring 19. The metal silicide film 26 according to the present embodiment is made of titanium silicon. The metal silicide film 26 corresponds to a second metal silicide film.

The configuration of the SiC semiconductor device according to the present embodiment is described above. The following describes a method of manufacturing the SiC semiconductor device according to the present embodiment with reference to FIGS. 6A to 6D.

Figure 6A:
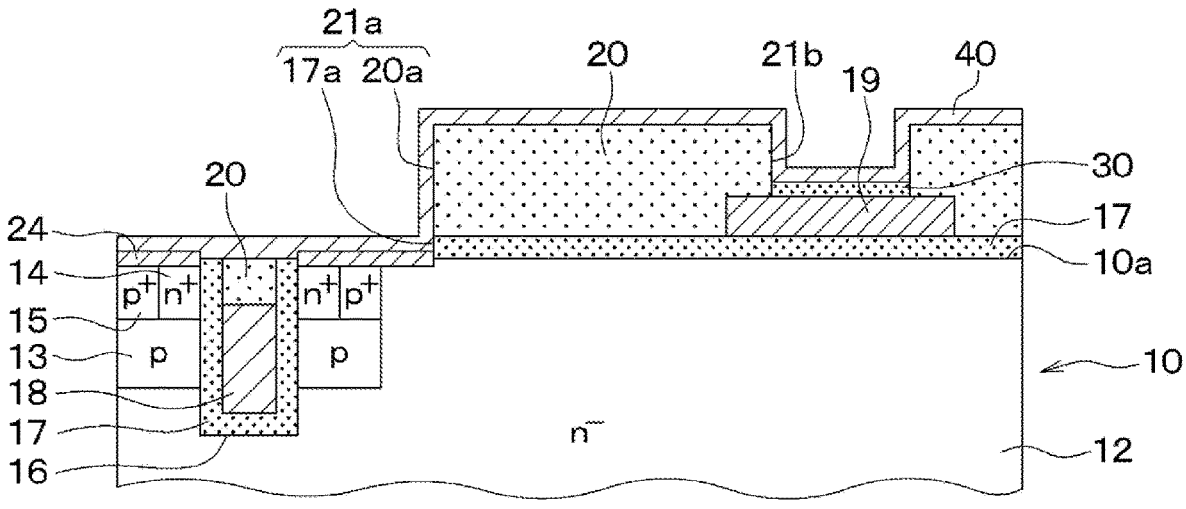
FIG. 6A is a cross-sectional view showing a manufacturing process of the SiC semiconductor device shown in FIG. 5.

In the present embodiment, after the unreacted metal layer 31a is removed through the process illustrated in FIG. 2G, a barrier metal layer 40 is formed by, for example, the CVD method as illustrated in FIG. 6A. The barrier metal layer 40 is made of material that hardly diffuse atoms as compared with the main wiring portion 23b. In the present embodiment, the titanium layer as the barrier metal layer 40 is formed.

Figure 6B:
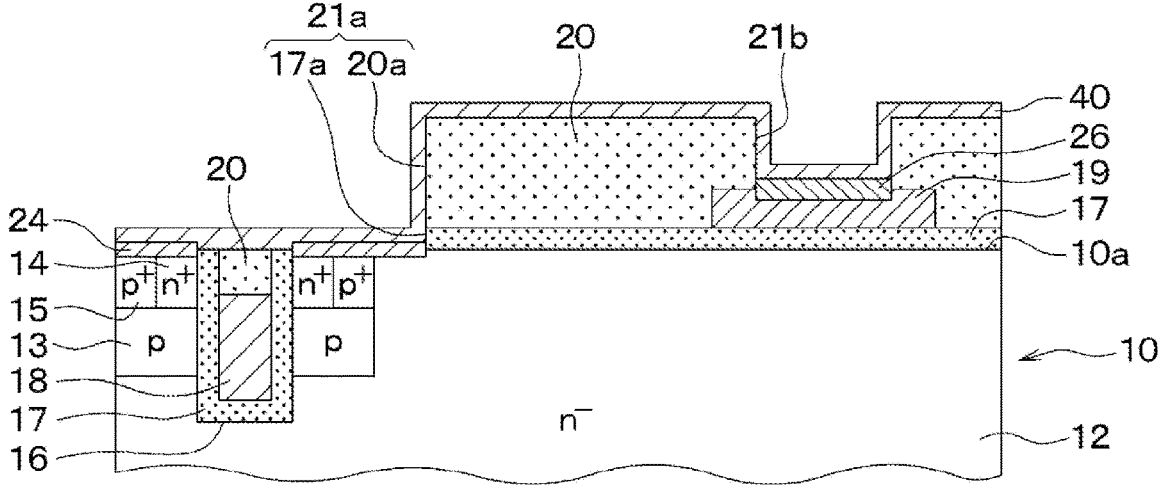
FIG. 6B is a cross-sectional view showing a manufacturing process of the SiC semiconductor device continued from FIG. 6A.

As illustrated in FIG. 6B, the heating treatment is performed at about 700 to 800 degrees Celsius in the nitrogen atmosphere. As a result, the oxide film 30 is removed by transporting the oxygen to the barrier metal layer 40. Since the heating treatment is performed at the temperature at 700 to 800 degrees Celsius, the connection wiring 19 is reacted with the barrier metal layer 40 to form the metal silicide film 26. Since the barrier metal layer 40 is made of material that is difficult to diffuse atoms, it is possible to suppress the diffusion of the atoms included in the barrier metal layer 40 into, for example, the connection wiring 19 in this process. In other words, the barrier metal layer 40 is made of material capable of removing the oxygen from the oxide film 30, as the material with difficulty to diffuse atoms into, for example, the connection wiring 19, when the metal silicide film 26 is formed. In the present embodiment, this process corresponds to the heating treatment for the gate wiring 23.

Figure 6C:
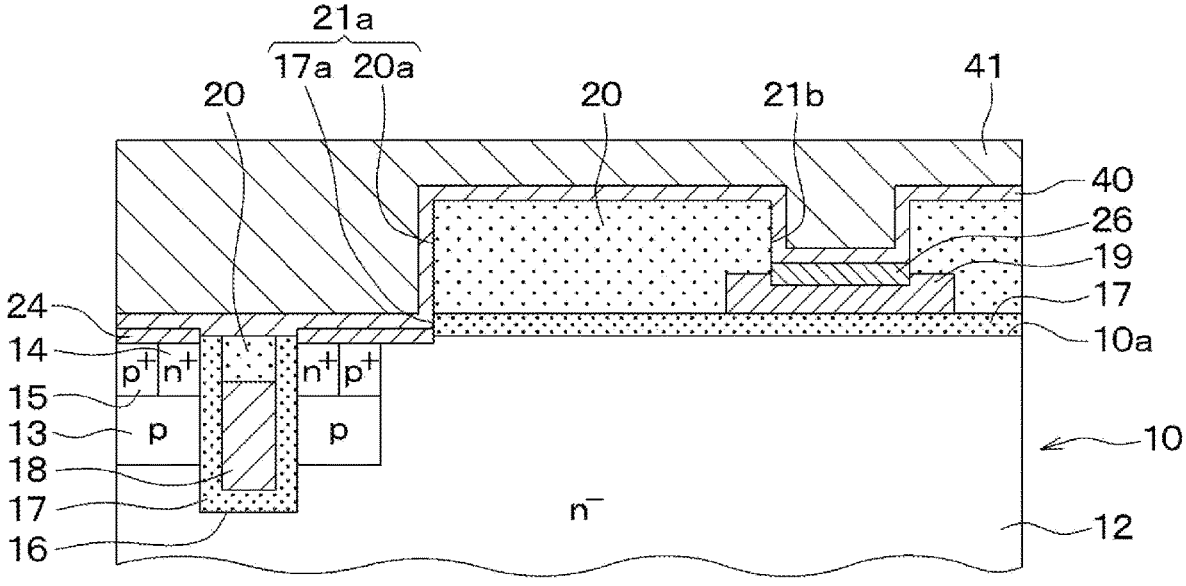
FIG. 6C is a cross-sectional view showing a manufacturing process of the SiC semiconductor device continued from FIG. 6B.
Figure 6D:
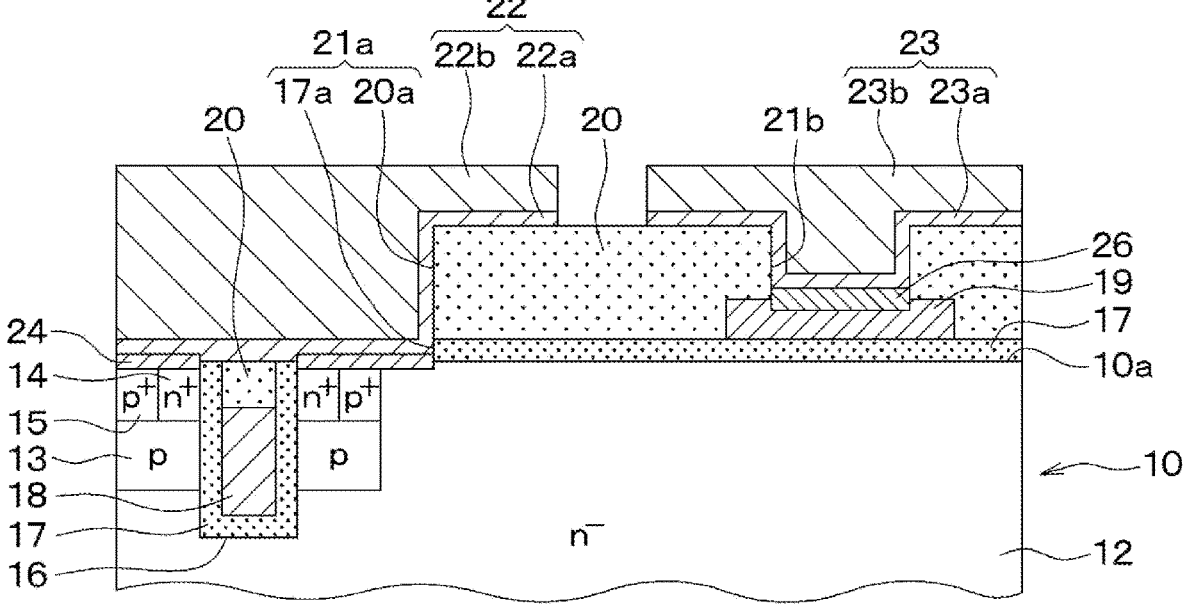
FIG. 6D is a cross-sectional view showing a manufacturing process of the SiC semiconductor device continued from FIG. 6C.

As illustrated in FIG. 6C, the main wiring layer 41 included in the main wiring portions 22b, 23b is formed. As illustrated in FIG. 6D, the barrier metal layer 40 and the main wiring layer 41 are patterned to form the source electrode 22 and the gate wiring 23 by performing, for example, etching with a mask (not shown).

Although not particularly shown, the SiC semiconductor device according to the present embodiment is manufactured by stabilizing the film quality of each of the source electrode 22 and the gate wiring 23 by performing the process similar to the one in FIG. 2I. In the present embodiment, since the oxide film is already removed, the oxide film 30 is not removed in this process.

According to the present embodiment as described above, the barrier metal layer 40, in other words, the barrier metal film 23a included in the gate wiring 23 is made of material capable of removing the oxygen from the oxide film 30. When the heating treatment for forming the metal silicide film 26 is performed, the oxide film 30 is removed by removing the oxygen from the oxide film 30 into the barrier metal layer 40. Therefore, it is not necessary to perform an individual process for removing the oxide film 30, and thus it is possible to attain the advantageous effect as similar to the one in the first embodiment.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

In the above-described embodiments, the MOSFET with the n-channel type trench gate structure in which the first conductivity type is n-type and the second conductivity type is p-type has been described. However, the semiconductor device formed with the MOSFET with a trench gate structure of a p-channel type in which the conductivity type of each component is inverted with respect to the n-channel type may also be used. Other than the MOSFET, the semiconductor device may be formed with an IGBT with the identical structure. In the case of IGBT, the n⁺-type substrate 11 in each of the embodiments is modified to the p⁺-type collector layer. Other than that, IGBT is similar to the MOSFET as described in the first embodiment.

Each of the above embodiments describes the semiconductor device includes the trench gate structure. However, the semiconductor device may also have a planar gate structure.

In each of the embodiments, the oxide film 30 formed in the manufacturing of the semiconductor device may have a thickness of 10 nm or larger. Even though such an oxide film 30 is formed, it is not necessary to perform an additional process for removing the oxide film 30 in the first and second embodiments. Therefore, it is possible to shorten the manufacturing process.

What is claimed is:

1. A method of manufacturing a silicon carbide semiconductor device, the method comprising:
preparing a semiconductor substrate made of silicon carbide, the semiconductor substrate including a substrate, a drift layer, a base layer, and an impurity region, the substrate having a first conductivity, the drift layer having the first conductivity and formed on the substrate, the base layer having a second conductivity and formed on the drift layer, the impurity region having the first conductivity and formed at a surface layer portion of the base layer, the preparing of the semiconductor substrate including
forming a gate insulation film at a portion of the base layer between the drift layer and the impurity region,
forming a gate electrode on the gate insulation film, and
forming a connection wiring above a surface of the semiconductor substrate at a side closer to the base layer, the connection wiring connected to the gate electrode and made of polysilicon;

forming an interlayer insulation film to cover the base layer, the impurity region, the gate electrode, and the connection wiring;

forming a first contact hole at a first region including the interlayer insulation film to expose the base layer and the impurity region;

forming a second contact hole at a second region including the interlayer insulation film to expose the connection wiring;

forming an oxide film at a portion of the connection wiring exposed from the second contact hole through thermal oxidation;

forming a metal layer over the semiconductor substrate including a portion exposed from the first contact hole;

forming a metal silicide film by reacting the metal layer with the semiconductor substrate through heating;

removing an unreacted metal layer as a portion of the metal layer different from the metal silicide film;

forming an electrode electrically connected to the base layer and the impurity region through the first contact hole; and forming a gate wiring electrically connected to the connection wiring through the second contact hole, the gate wiring having a portion made of material capable of deoxidizing the oxide film formed on the connection wiring to remove oxygen from the oxide film, wherein, in the forming of the gate wiring, the oxide film is removed by deoxidizing the oxide film to remove the oxygen from the oxide film into the gate wiring in a same process of heating treatment for the gate wiring, wherein the preparing of the semiconductor substrate further includes terminating a dangling bond at an interface between the semiconductor substrate and the gate insulation film with nitrogen after the forming of the gate electrode, and wherein, in the forming of the oxide film, the oxide film is formed to have a thickness of 1 nanometer or more and less than 3 nanometers.

2. The method according to claim 1, wherein the heating treatment for the gate wiring includes stabilizing film quality of the gate wiring after the forming of the gate wiring, and wherein the oxide film is removed in the stabilizing of the film quality of the gate wiring.

3. The method according to claim 1, wherein in the forming of the metal silicide film, the metal silicide film is formed by the heating in a temperature range of 700 to 800 degrees Celsius.

4. The method according to claim 1, wherein in the forming of the oxide film, the oxide film is formed by dry oxidation at 700 degrees Celsius.

5. The method according to claim 1, wherein in the forming of the oxide film, the oxide film is formed by pyrooxidation at 700 degrees Celsius.

6. The method according to claim 1, wherein the electrode is directly connected to the base layer and the impurity region through the first contact hole, and the gate wiring is directly connected to the connection wiring through the second contact hole.

7. A method of manufacturing a silicon carbide semiconductor device, the method comprising:

preparing a semiconductor substrate made of silicon carbide, the semiconductor substrate including a substrate, a drift layer, a base layer, and an impurity region, the substrate having a first conductivity, the drift layer having the first conductivity and formed on the substrate, the base layer having a second conductivity and formed on the drift layer, the impurity region having the first conductivity and formed at a surface layer portion of the base layer, the preparing of the semiconductor substrate including forming a gate insulation film at a portion of the base layer between the drift layer and the impurity region, forming a gate electrode on the gate insulation film, and forming a connection wiring above a surface of the semiconductor substrate at a side closer to the base layer, the connection wiring connected to the gate electrode and made of polysilicon;

forming an interlayer insulation film to cover the base layer, the impurity region, the gate electrode, and the connection wiring;

forming a first contact hole at a first region including the interlayer insulation film to expose the base layer and the impurity region;

forming a second contact hole at a second region including the interlayer insulation film to expose the connection wiring;

forming an oxide film at a portion of the connection wiring exposed from the second contact hole through thermal oxidation;

forming a metal layer over the semiconductor substrate including a portion exposed from the first contact hole;

forming a metal silicide film by reacting the metal layer with the semiconductor substrate through heating;

removing an unreacted metal layer as a portion of the metal layer different from the metal silicide film;

forming an electrode electrically directly connected to the base layer and the impurity region through the first contact hole; and forming a gate wiring electrically directly connected to the connection wiring through the second contact hole, the gate wiring having a portion made of material capable of deoxidizing the oxide film formed on the connection wiring to remove oxygen from the oxide film, wherein, in the forming of the gate wiring, the oxide film is removed by deoxidizing the oxide film to remove the oxygen from the oxide film into the gate wiring in the same process of heating treatment for the gate wiring, wherein the preparing of the semiconductor substrate further includes terminating a dangling bond at an interface between the semiconductor substrate and the gate insulation film with nitrogen after the forming of the gate electrode, and wherein, in the forming of the oxide film, the oxide film is formed to have a thickness in a range of 1 to 10 nanometers.

\* \* \* \* \*